(12) United States Patent
Su et al.

(10) Patent No.: US 12,293,792 B2
(45) Date of Patent: May 6, 2025

(54) VOLTAGE PREDICTION METHOD, MEMORY STORAGE DEVICE AND MEMORY CONTROL CIRCUIT UNIT

(71) Applicant: PHISON ELECTRONICS CORP., Miaoli (TW)

(72) Inventors: Po-Cheng Su, Hsinchu (TW); Po-Hao Chen, Hsinchu County (TW); Yu-Cheng Hsu, Yilan County (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 147 days.

(21) Appl. No.: 18/298,335

(22) Filed: Apr. 10, 2023

(65) Prior Publication Data

US 2024/0304259 A1    Sep. 12, 2024

(30) Foreign Application Priority Data

Mar. 8, 2023    (TW) .................................. 112108586

(51) Int. Cl.
*G11C 16/08*   (2006.01)
*G11C 16/26*   (2006.01)
*G11C 16/34*   (2006.01)

(52) U.S. Cl.
CPC .............. *G11C 16/26* (2013.01); *G11C 16/08* (2013.01); *G11C 16/3404* (2013.01)

(58) Field of Classification Search
CPC ..... G11C 16/26; G11C 16/08; G11C 16/3404; G11C 11/5642; G11C 16/0483
See application file for complete search history.

(56) References Cited

U.S. PATENT DOCUMENTS

| | | | |
|---|---|---|---|
| 2020/0409788 A1* | 12/2020 | Kurose | G11C 16/0483 |
| 2022/0326884 A1* | 10/2022 | Kang | G06F 13/28 |
| 2023/0108845 A1* | 4/2023 | Jang | G11C 29/028 |
| | | | 365/185.21 |

* cited by examiner

*Primary Examiner* — Mohammed A Bashar
(74) *Attorney, Agent, or Firm* — JCIPRNET

(57) ABSTRACT

A voltage prediction method, a memory storage device and a memory control circuit unit are disclosed. The method includes: reading a plurality of memory cells in a rewritable non-volatile memory module by using a first read voltage level to obtain count information, and the first read voltage level is configured to distinguish a first state and a second state adjacent to each other in a threshold voltage distribution of the memory cells, and the count information reflects a total number of first memory cells meeting a target condition among the memory cells; and predicting a second read voltage level according to the count information, and the second read voltage level is configured to distinguish a third state and a fourth state adjacent to each other in the threshold voltage distribution.

27 Claims, 9 Drawing Sheets

VOLTAGE PREDICTION METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 112108586, filed on Mar. 8, 2023. The entirety of the above-mentioned patent application is hereby incorporated by reference herein and made a part of this specification.

BACKGROUND

Technical Field

The disclosure relates to a memory management technology, and in particular relates to a voltage prediction method, a memory storage device, and a memory control circuit unit.

Description of Related Art

As smartphones, tablets, and personal computers have grown rapidly in recent years, the demand of the consumers for storage media has also increased rapidly. Since a rewritable non-volatile memory module (e.g. a flash memory) has the characteristics of data non-volatility, power saving, small size, and having no mechanical structure, it is very suitable for being built in a variety of portable multimedia devices as exemplified above.

In a memory storage device in which a memory cell may store multiple bits, multiple preset read voltage levels are configured to read data stored in memory cells belonging to different states. However, after the memory storage device has been used for a period of time, as the memory cells wear out, these preset read voltage levels may severely offset relative to the threshold voltage distribution of the memory cells. Traditionally, the memory controller uses the read voltage level to be corrected to read the memory cells one by one to obtain offset information corresponding to the read voltage level, and then uses the offset information to correct the read voltage level. However, as the number of bits stored in each memory cell increases, the number of read voltage levels that need to be corrected also increases. Therefore, how to improve the correction efficiency of the read voltage level is one of the subjects that those skilled in the art are devoted to research.

SUMMARY

A voltage prediction method, a memory storage device, and a memory control circuit unit are provided in the disclosure, which may improve the correction efficiency of the read voltage level.

An exemplary embodiment of the disclosure provides a voltage prediction method for a rewritable non-volatile memory module. The voltage prediction method includes the following operation. Multiple memory cells in a rewritable non-volatile memory module are read by using a first read voltage level to obtain count information. The first read voltage level is configured to distinguish a first state and a second state adjacent to each other in a threshold voltage distribution of the memory cells, and the count information reflects a total number of first memory cells meeting a target condition among the memory cells. A second read voltage level is predicted according to the count information. The second read voltage level is configured to distinguish a third state and a fourth state adjacent to each other in the threshold voltage distribution.

An exemplary embodiment of the disclosure further provides a memory storage device, which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The memory control circuit unit is configured to perform the following operation. At least one read command sequence is sent, in which the at least one read command sequence is configured to instruct to read multiple memory cells in a rewritable non-volatile memory module by using a first read voltage level to obtain count information. The first read voltage level is configured to distinguish a first state and a second state adjacent to each other in a threshold voltage distribution of the memory cells, and the count information reflects a total number of first memory cells meeting a target condition among the memory cells. A second read voltage level is predicted according to the count information. The second read voltage level is configured to distinguish a third state and a fourth state adjacent to each other in the threshold voltage distribution.

An exemplary embodiment of the disclosure further provides a memory control circuit unit for controlling a rewritable non-volatile memory module. The memory control circuit unit includes a host interface, a memory interface, and a memory management circuit. The host interface is configured to couple to the host system. The memory interface is configured to couple to the rewritable non-volatile memory module. The memory management circuit is coupled to the host interface and the memory interface. The memory management circuit is configured to perform the following operation. At least one read command sequence is sent, in which the at least one read command sequence is configured to instruct to read multiple memory cells in a rewritable non-volatile memory module by using a first read voltage level to obtain count information. The first read voltage level is configured to distinguish a first state and a second state adjacent to each other in a threshold voltage distribution of the memory cells, and the count information reflects a total number of first memory cells meeting a target condition among the memory cells. A second read voltage level is predicted according to the count information. The second read voltage level is configured to distinguish a third state and a fourth state adjacent to each other in the threshold voltage distribution.

Based on the above, after using the first read voltage level to read multiple memory cells in the rewritable non-volatile memory module to obtain the count information, the second read voltage level may be predicted according to the count information. In particular, the first read voltage level is configured to distinguish the first state and the second state adjacent to each other in the threshold voltage distribution of the memory cells, and the second read voltage level is configured to distinguish the third state and the fourth state adjacent to each other in the threshold voltage distribution. Thereby, the correction efficiency of the read voltage level may be effectively improved.

DETAILED DESCRIPTION OF DISCLOSED EMBODIMENTS

In general, a memory storage device (also referred to as a memory storage system) includes a rewritable non-volatile memory module and a controller (also referred to as a control circuit). The memory storage device may be used with a host system so that the host system may write data to or read data from the memory storage device.

Figure 1:
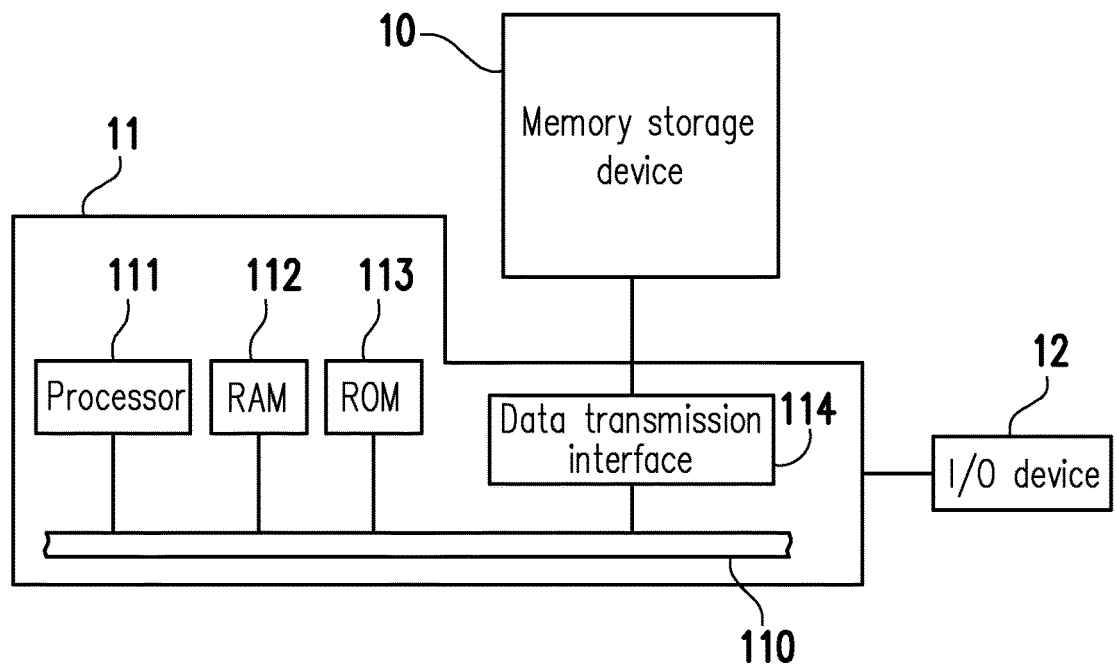
FIG. 1 is a schematic diagram of a host system, a memory storage device, and an input/output (I/O) device according to an exemplary embodiment of the disclosure.
Figure 2:
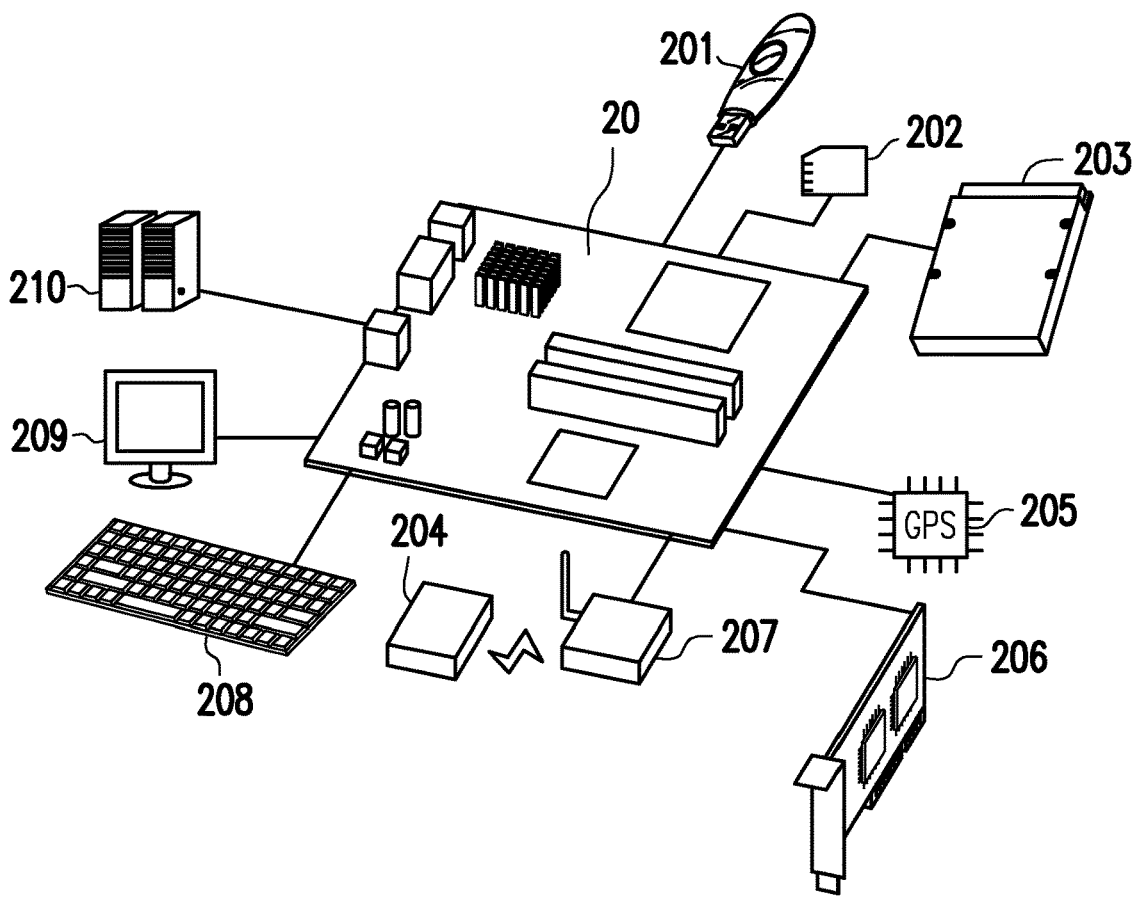
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to a memory storage device 10 through the data transfer interface 114. For example, the host system 11 may store data to or read data from the memory storage device 10 via the data transmission interface 114. In addition, the host system 11 may be coupled to an I/O device 12 through the system bus 110. For example, the host system 11 may transmit output signals to or receive input signals from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. The motherboard 20 may be coupled to the memory storage device 10 through the data transmission interface 114 via a wired or wireless connection.

In an exemplary embodiment, the memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard 20 may also be coupled to various I/O devices, such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include the memory storage device 30 and the host system 31 of FIG. 3.

Figure 3:
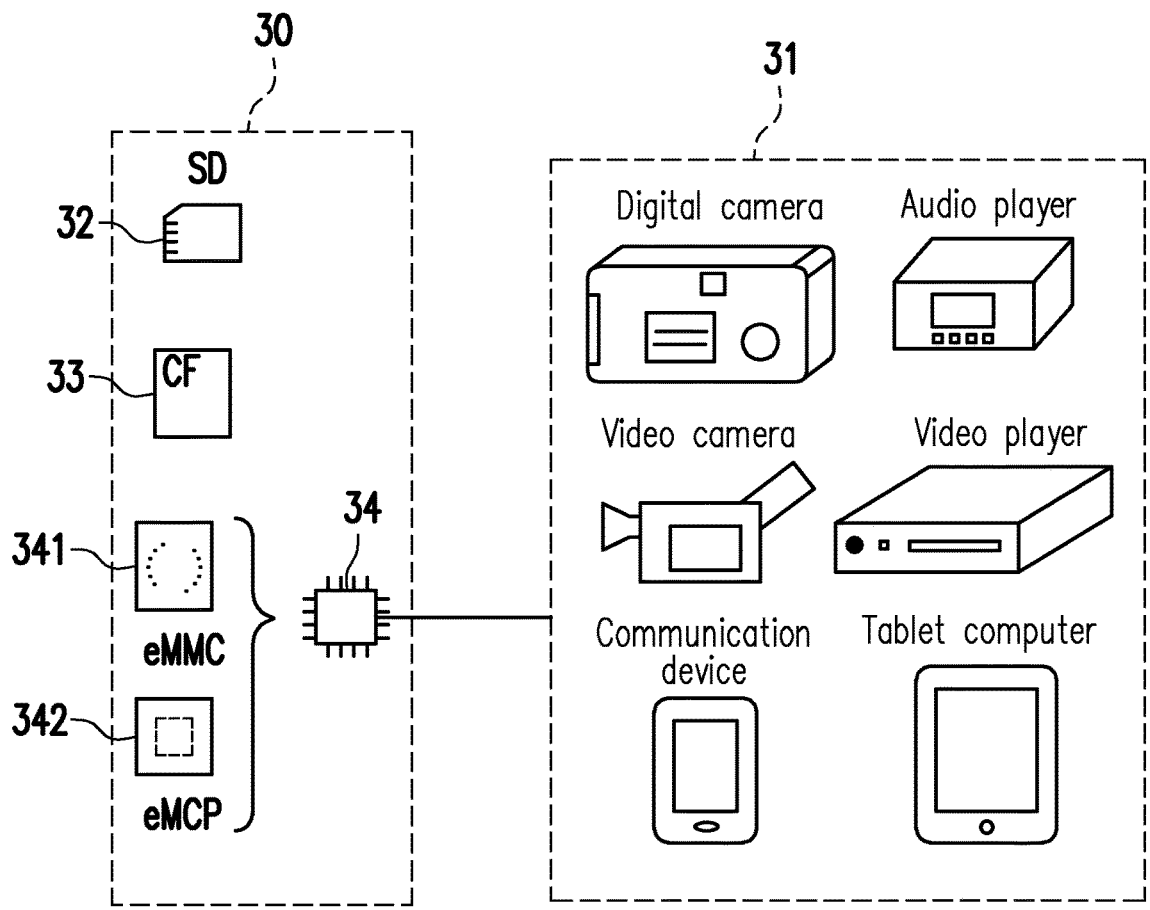
FIG. 3 is a schematic diagram of a host system and a memory storage device according to an exemplary embodiment of the disclosure.

FIG. 3 is a schematic diagram of a host system and a memory storage device according to an exemplary embodiment of the disclosure.

Referring to FIG. 3, the memory storage device 30 may be used in conjunction with the host system 31 to store data. For example, the host system 31 may be a digital camera, a video camera, a communication device, an audio player, a video player, or a tablet computer system. For example, the memory storage device 30 may be various non-volatile memory storage devices, such as a secure digital (SD) card 32, a compact flash (CF) card 33, or an embedded storage device 34, etc., used in the host system 31. The embedded storage device 34 includes various embedded storage devices that directly couple a memory module to a substrate of the host system, such as an embedded multimedia card (eMMC) 341 and/or an embedded multi-chip package (eMCP) storage device 342, etc.

Figure 4:
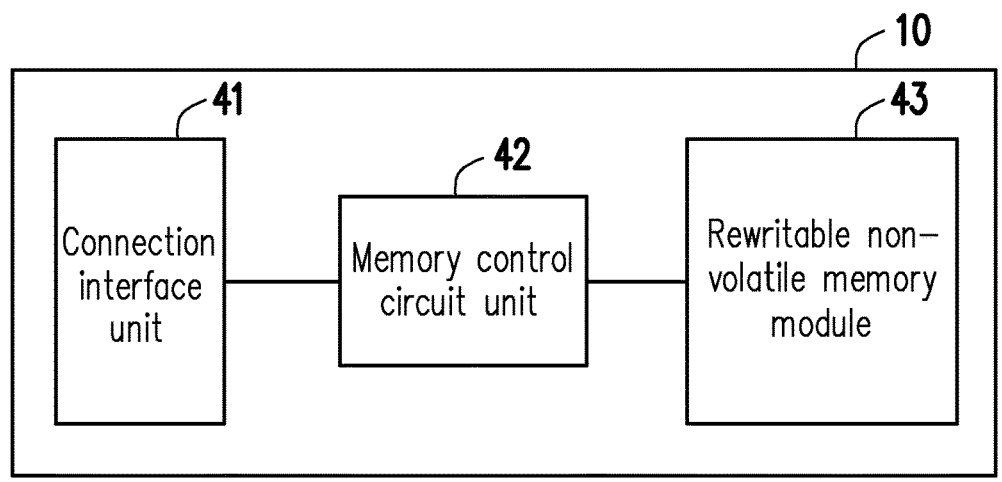
FIG. 4 is a schematic diagram of a memory storage device according to an exemplary embodiment of the disclosure.

FIG. 4 is a schematic diagram of a memory storage device according to an exemplary embodiment of the disclosure.

Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may communicate with the host system 11 via the connection interface unit 41. In an exemplary embodiment, the connection interface unit 41 is compatible with the peripheral component interconnect express (PCI Express) standard. In an exemplary embodiment, the connection interface unit 41 may also be compliant to the serial advanced technology attachment (SATA) standard, the parallel advanced technology attachment (PATA) standard, the institute of electrical and electronics engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 may be packaged in a chip with the memory control circuit unit 42, or the connection interface unit 41 may be disposed outside a chip including the memory control circuit unit 42.

The memory control circuit unit 42 is coupled to the connection interface unit 41 and the rewritable non-volatile memory module 43. The memory control circuit unit 42 is configured to execute multiple logic gates or control commands implemented in a hardware form or a firmware form and to perform operations such as writing, reading, and erasing of data in the rewritable non-volatile memory module 43 according to the commands of the host system 11.

The rewritable non-volatile memory module 43 is configured to store the data written by the host system 11. The rewritable non-volatile memory module 43 may include a single level cell (SLC) NAND-type flash memory module (i.e., a flash memory that may store 1 bit in one memory cell), multi-level cell (MLC) NAND-type flash memory module (i.e., a flash memory module that may store 2 bits in one memory cell), a triple level cell (TLC) NAND-type flash memory module (i.e., a flash memory module that may store 3 bits in one memory cell), a quad level cell (QLC) NAND-type flash memory module (i.e., a flash memory module that may store 4 bits in one memory cell), other flash memory modules, or other memory modules with the same characteristics.

Each memory cell in the rewritable non-volatile memory module 43 stores one or more bits by a change in a voltage (also referred to as a threshold voltage hereinafter). Specifically, there is a charge trapping layer between a control gate and a channel of each of the memory cells. By applying a write voltage to the control gate, the amount of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each of the memory cells in the rewritable non-volatile memory module 43 has multiple storage states. By applying a read voltage, it may be determined which storage state a memory cell belongs to, thereby obtaining the one or more bits stored in the memory cell.

In an exemplary embodiment, the memory cells of the rewritable non-volatile memory module 43 may constitute multiple physical programming units, and the physical programming units may constitute multiple physical erasing units. Specifically, memory cells on the same word line may form one or more physical programming units. If a memory cell may store two or more bits, the physical programming units on the same word line may be classified at least as lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the present exemplary embodiment, the physical programming unit is the minimum unit for programming. That is, the physical programming unit is the minimum unit for write data. For example, the physical programming unit may be a physical page or a physical sector. If the physical programming unit is a physical page, then the physical programming unit may include a data bit area and a redundancy bit area. The data bit area includes multiple physical sectors configured to store user data, and the redundant bit area is configured to store system data (e.g., management data such as error correction codes). In an exemplary embodiment, the data bit area includes 32 physical sectors, and the size of a physical sector is 512 bytes (B). However, in other exemplary embodiments, the data bit area may also include 8, 16, or a greater or lesser number of physical sectors, and the size of each of the physical sectors may also be larger or smaller. On the other hand, the physical erasing unit is the minimum unit for erasing. That is, each of the physical erasing units includes the smallest number of memory cells to be erased together. For example, the physical erasing unit is a physical block.

Figure 5:
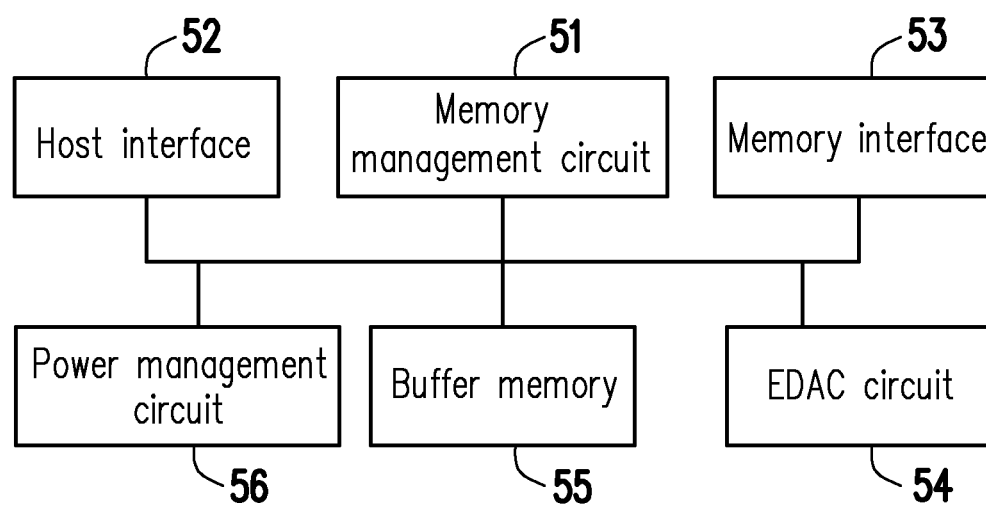
FIG. 5 is a schematic diagram of a memory control circuit unit according to an exemplary embodiment of the disclosure.

FIG. 5 is a schematic diagram of a memory control circuit unit according to an exemplary embodiment of the disclosure.

Referring to FIG. 5, the memory control circuit unit 42 includes a memory management circuit 51, a host interface 52, and a memory interface 53. The memory management circuit 51 is configured to control the overall operation of the memory control circuit unit 42. Specifically, the memory management circuit 51 has multiple control commands, and when the memory storage device 10 operates, the control commands are executed to perform operations such as writing, reading, and erasing data. The following description of the operation of the memory management circuit 51 is equivalent to the description of the operation of the memory control circuit unit 42.

In an exemplary embodiment, the control commands of the memory management circuit 51 are implemented in a firmware form. For example, the memory management circuit 51 has a microprocessor unit (not shown) and a read only memory (not shown), and the control commands are programmed into the read only memory. When the memory storage device 10 operates, the control commands are executed by the microprocessor unit to perform operations such as writing, reading, and erasing data.

In an exemplary embodiment, the control commands of the memory management circuit 51 may also be stored in a specific area of the rewritable non-volatile memory module 43 (for example, a system area dedicated to storing system data in the memory module) in a program code form. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first executes the boot code to load the control commands stored in the rewritable non-volatile memory module 43 into the random access memory of the memory management circuit 51. Thereafter, the microprocessor unit runs these control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells or a memory cell group of the rewritable non-volatile memory module 43. The memory writing circuit is configured to issue a write command sequence to the rewritable non-volatile memory module 43 to write data into the rewritable non-volatile memory module 43. The memory reading circuit is configured to issue a read command sequence to the rewritable non-volatile memory module 43 to read data from the rewritable non-volatile memory module 43. The memory erasing circuit is configured to issue an erase command sequence to the rewritable non-volatile memory module 43 to erase data from the rewritable non-volatile memory module 43. The data processing circuit is configured to process the data to be written into the rewritable non-volatile memory module 43 and the data read from the rewritable non-volatile memory module 43. The write command sequence, the read command sequence and the erase command sequence may respectively include one or more program codes or command codes for instructing the rewritable non-volatile memory module 43 to perform corresponding writing, reading, and erasing operations. In an exemplary embodiment, the memory management circuit 51 may also issue other types of command sequences to the rewritable non-volatile memory module 43 to instruct the rewritable non-volatile memory module 43 to perform corresponding operations.

The host interface 52 is coupled to the memory management circuit 51. The memory management circuit 51 may communicate with the host system 11 through the host interface 52. The host interface 52 may be configured to receive and identify the commands and data transmitted by the host system 11. For example, the commands and data transmitted by the host system 11 may be transmitted to the memory management circuit 51 through the host interface 52. In addition, the memory management circuit 51 may transmit data to the host system 11 through the host interface 52. In this exemplary embodiment, the host interface 52 is compatible with the PCI Express standard. However, it should be understood that the disclosure is not limited thereto, and the host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is configured to access the rewritable non-volatile memory module 43. For example, the memory management circuit 51 may access the rewritable non-volatile memory module 43 through the memory interface 53. In other words, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits a corresponding command sequence. For example, the command sequences may include a write command sequence to instruct data writing, a read command sequence to instruct data reading, an erase command sequence to instruct data erasing, and corresponding command sequences for instructing various memory operations (e.g., changing the read voltage level, executing a garbage collection operation, etc.). These command sequences are, for example, generated by the memory management circuit 51 and transmitted to the rewritable non-volatile memory module 43 via the memory interface 53. These command sequences may include one or more signals or data on the bus. The signals or data may include command codes or program codes. For example, the read command sequence includes information such as the read identification code, the memory address, etc.

In an exemplary embodiment, the memory control circuit unit 42 further includes an error detecting and correcting circuit 54, a buffer memory 55, and a power management circuit 56.

The error detecting and correcting circuit 54 is coupled to the memory management circuit 51 and is configured to execute an error detecting and correcting operation to ensure the correctness of the data. Specifically, when the memory management circuit 51 receives a write command from the host system 11, the error detecting and correcting circuit 54 generates a corresponding error correcting code (ECC) and/or error detecting code (EDC) for the data corresponding to the write command, and the memory management circuit 51 writes the data corresponding to the write command and the corresponding error correcting code and/or error detecting code to the rewritable non-volatile memory module 43. Thereafter, when the memory management circuit 51 reads data from the rewritable non-volatile memory module 43, it simultaneously reads the error correcting code and/or the error detecting code corresponding to the data, and the error detecting and correcting circuit 54 executes the error detecting and correcting operation on the read data according to the error correcting code and/or error detecting code.

The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
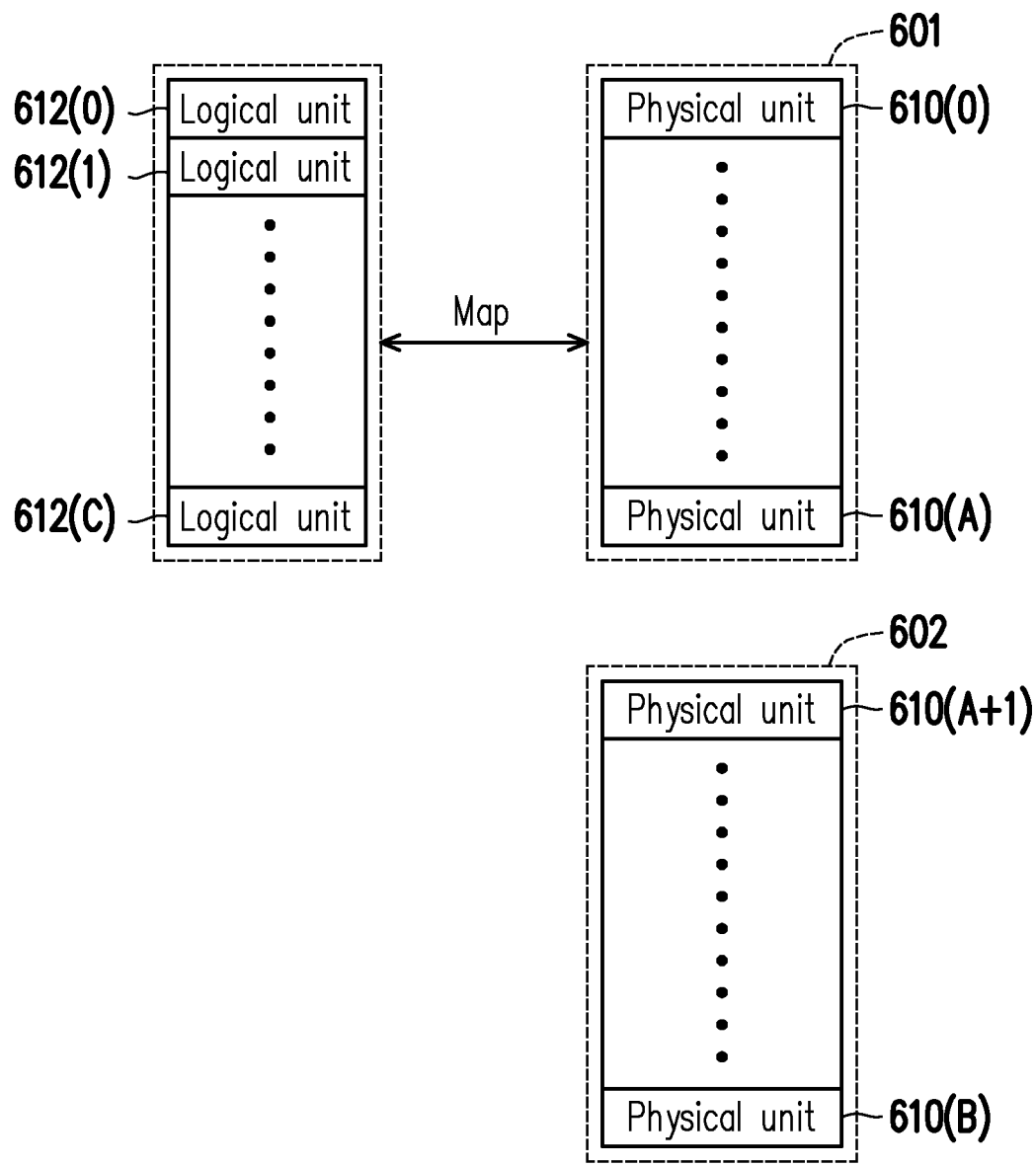
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure.

Referring to FIG. 6, the memory management circuit 51 may logically group the physical units 610(0) to 610(B) in the rewritable non-volatile memory module 43 into a storage area 601 and a spare area 602. Each physical unit may include one or more physical programming units.

The physical units 610(0) to 610(A) in the storage area 601 are configured to store user data (e.g., user data from the host system 11 of FIG. 1). For example, the physical units 610(0) to 610(A) in the storage area 601 may store valid data and/or invalid data. The physical units 610(A+1) to 610(B) in the spare area 602 do not store data (e.g., valid data). For example, if a certain physical unit does not store valid data, this physical unit may be associated (or added) to the spare area 602. In addition, the physical units in the spare area 602 (or the physical units not storing valid data) may be erased. When new data is written, one or more physical units may be extracted from the spare area 602 to store the new data. In an exemplary embodiment, the spare area 602 is also referred to as a free pool.

The logic units 612(0) to 612(C) may be configured in the memory management circuit 51 to map the physical units 610(0) to 610(A) in the storage area 601. In an exemplary embodiment, each of the logical units corresponds to a logical address. For example, a logical address may include one or more logical block addresses (LBA) or other logical management units. In an exemplary embodiment, a logical unit may also correspond to a logical programming unit or be formed by multiple consecutive or non-consecutive logical addresses.

It should be noted that a logical unit may be mapped to one or more physical units. If a certain physical unit is currently mapped by a certain logical unit, it means that the data currently stored in this physical unit includes valid data. On the contrary, if a certain physical unit is not currently mapped by any logical unit, it means that the data currently stored in this physical unit is invalid data.

The memory management circuit 51 may record the management data (also referred to as the logical to physical mapping information) describing the mapping relationship between logical units and physical units in at least one logical to physical mapping table. When the host system 11 reads data from the memory storage device 10 or writes data to the memory storage device 10, the memory management circuit 51 may access the rewritable non-volatile memory module 43 according to the information in the logical to physical mapping table.

In the following exemplary embodiment, a QLC NAND flash memory module is used as the type of flash memory module included in the rewritable non-volatile memory module 43 for illustration. However, in another exemplary embodiment, the same or similar operations may also be applied to MLC NAND, TLC NAND, or other types of flash memory modules.

In an exemplary embodiment, before storing certain data (also referred to as raw data) in the rewritable non-volatile memory module 43, the memory management circuit 51 performs a randomization operation on the raw data to randomize the raw data into another data (also referred to as random data). For example, after the randomization operation, the number of bits "0" and "1" in the random data may tend to be consistent (i.e., equal or close).

In an exemplary embodiment, the memory management circuit 51 may send a write command sequence to the rewritable non-volatile memory module 43 to instruct the rewritable non-volatile memory module 43 to program the randomized raw data (i.e., the random data) to multiple memory cells. For example, a programmed memory cell may be attempted to be evenly programmed to store bits "1111", "1110", "1101", "1100", "1011", "1010", "1001", "1000", "0111", "0110", "0101", "0100", "0011", "0010", "0001" and "0000".

In an exemplary embodiment, the raw data is from the host system 11 and has data to be stored in the memory storage device 10. This raw data may be randomized before storage. In an exemplary embodiment, the number of bits of the raw data is the same as that of the random data.

Figure 7:
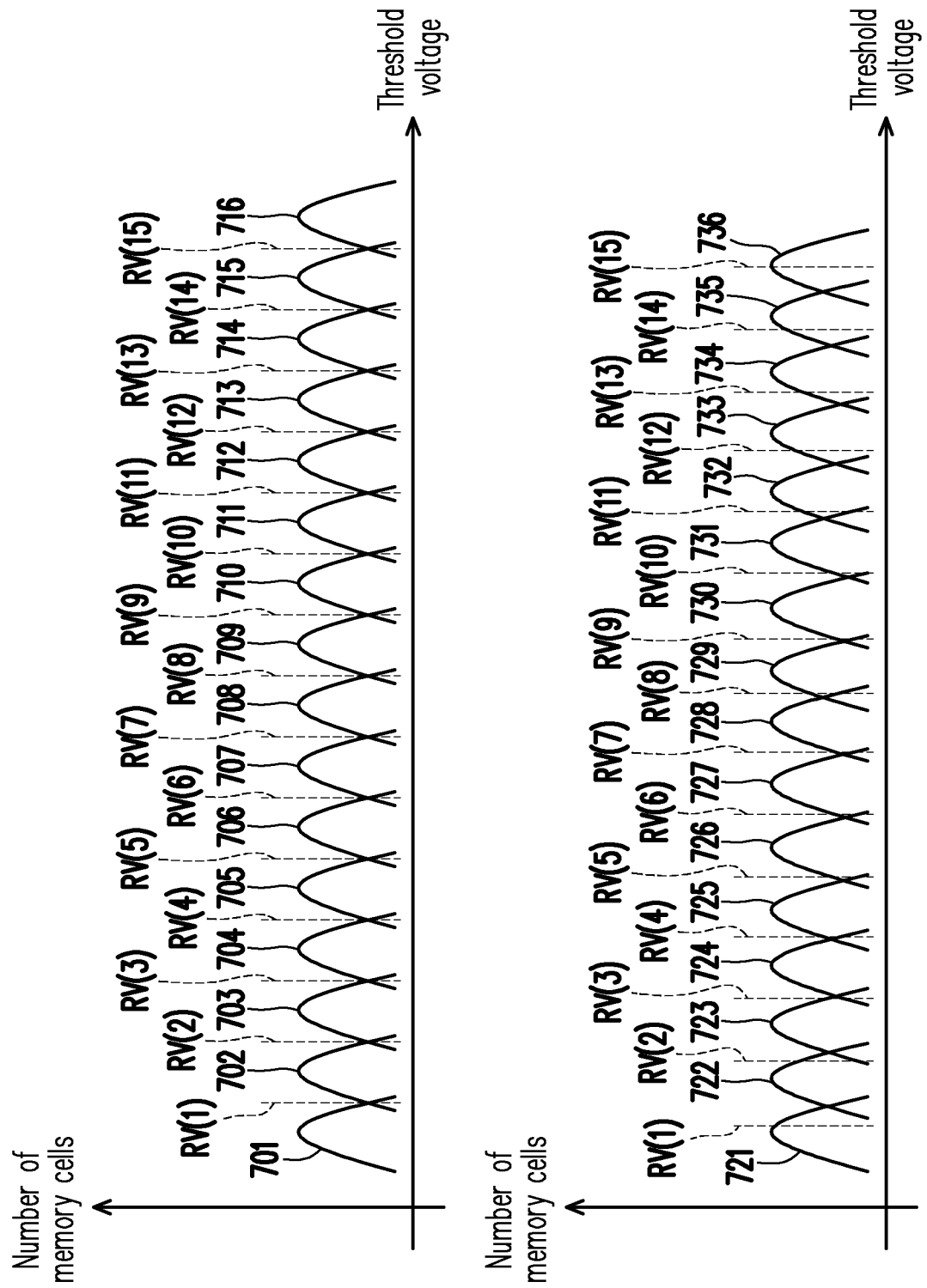
FIG. 7 is a schematic diagram of a threshold voltage distribution of a memory cell according to an exemplary embodiment of the disclosure.

FIG. 7 is a schematic diagram of a threshold voltage distribution of a memory cell according to an exemplary embodiment of the disclosure. It should be noted that FIG. 7 shows the threshold voltage distribution of the programmed memory cells after the memory cells located on the same word line are programmed according to the random data. In addition, in FIG. 7, the horizontal axis represents the threshold voltage of the memory cell, and the vertical axis represents the number of memory cells.

Referring to FIG. 7, the programmed memory cells may have 16 states 701 to 716. The memory cells belonging to the states 701 to 716 may be respectively configured to store bits "1111", "1110", "1101", "1100", "1011", "1010", "1001", "1000", "0111", "0110", "0101", "0100", "0011", "0010", "0001" and "0000". In other words, the states 701 to 716 correspond to preset bit values "1111", "1110", "1101", "1100", "1011", "1010", "1001", "1000", "0111", "0110", "0101", "0100", "0011", "0010", "0001", and "0000". However, in another exemplary embodiment, the number of states 701 to 716 may be adjusted, and the preset bit value corresponding to each state may also be adjusted.

In an exemplary embodiment, it is assumed that the programmed memory cells may be evenly distributed to the states 701 to 716. That is, if the total number of these memory cells is N, and the total number of states 701 to 716 is M (i.e., 16), then the total number of memory cells belonging to each state in states 701 to 716 is preset to be N/M (i.e., N/16).

When data is to be read, the read voltage levels RV(1) to RV(15) may be applied to the memory cells to read the data stored in these memory cells. It should be noted that in FIG. 7, the read voltage level RV(i) may be configured to distinguish any two adjacent states in the threshold voltage distribution of these memory cells. For example, the read voltage level RV(1) is configured to distinguish states 701 and 702, the read voltage level RV(2) is configured to distinguish states 702 and 703, and so on.

By sequentially applying read voltage levels RV(1) to RV(15), a certain memory cell among these memory cells may be determined as belonging to one of the states 701 to 716, and then the data stored in the memory cell is obtained. For example, if a certain memory cell may be turned on by the read voltage level RV(2) but not by the read voltage level RV(3), it means that the threshold voltage of this memory cell is between the read voltage level RV(2) and RV(3). Therefore, it may be determined that the memory cell belongs to state 703 and the data stored in the memory cell may be read.

However, as the usage time of these memory cells increases and/or the operating environment changes, at least some of the memory cells may experience performance degradation. After the performance degradation occurs, the states 701 to 716 may gradually approach each other or even overlap each other. Additionally, states 701 to 716 may also become flatter. For example, the states 721 to 736 may be configured to represent the threshold voltage distribution of the memory cells after performance degradation.

After the degradation occurs, the read voltage levels RV(1) to RV(15) are severely offset relative to the states 721 to 736, as shown in FIG. 7. At this time, if these memory cells are continuously read using the uncorrected read voltage levels RV(1) to RV(15), the states of many memory cells will be misjudged, which results in many errors in the data read from these memory cells. If the read data includes too many errors, the data may not be successfully decoded and output.

In an exemplary embodiment, the memory management circuit 51 may send at least one read command sequence to the rewritable non-volatile memory module 43. The read command sequence may be configured to instruct the rewritable non-volatile memory module 43 to use a read voltage level (also referred to as the first read voltage level) to read multiple memory cells in the rewritable non-volatile memory module 43 to obtain count information (also referred to as first count information). In particular, the first read voltage level may be configured to distinguish two adjacent states (also referred to as the first state and the second state) in the threshold voltage distribution of the memory cells. In addition, the first count information may reflect the total number of memory cells (also referred to as the first memory cells) meeting a specific condition (also referred to as a target condition) among the memory cells. Taking FIG. 7 as an example, the first read voltage level may be the read voltage level RV(i) among the read voltage levels RV(1) to RV(15), and the first count information may reflect the total number of memory cells (i.e., the first memory cells) that may be turned on by the first read voltage level among the memory cells. Alternatively, from another point of view, the first count information may reflect the total number of memory cells (i.e., the first memory cells) whose threshold voltage is lower than the first read voltage level among the memory cells.

In an exemplary embodiment, the memory management circuit 51 may predict another read voltage level (also referred to as a second read voltage level) according to the first count information. In particular, the second read voltage level may be configured to distinguish another two adjacent states (also referred to as the third state and the fourth state) in the threshold voltage distribution. Taking FIG. 7 as an example, the second read voltage level may be the read voltage level RV(j) among the read voltage levels RV(1) to RV(15), and i is not equal to j.

In an exemplary embodiment, the operation of the memory management circuit 51 to predict the second read voltage level according to the first count information may be configured to predict the corrected second read voltage level. For example, the corrected second read voltage level may be closer to the boundary between the third state and the fourth state than the uncorrected second read voltage level. Therefore, in an exemplary embodiment, the corrected second read voltage level may be configured to distinguish the third state and the fourth state more accurately than the uncorrected second read voltage level.

Figure 8:
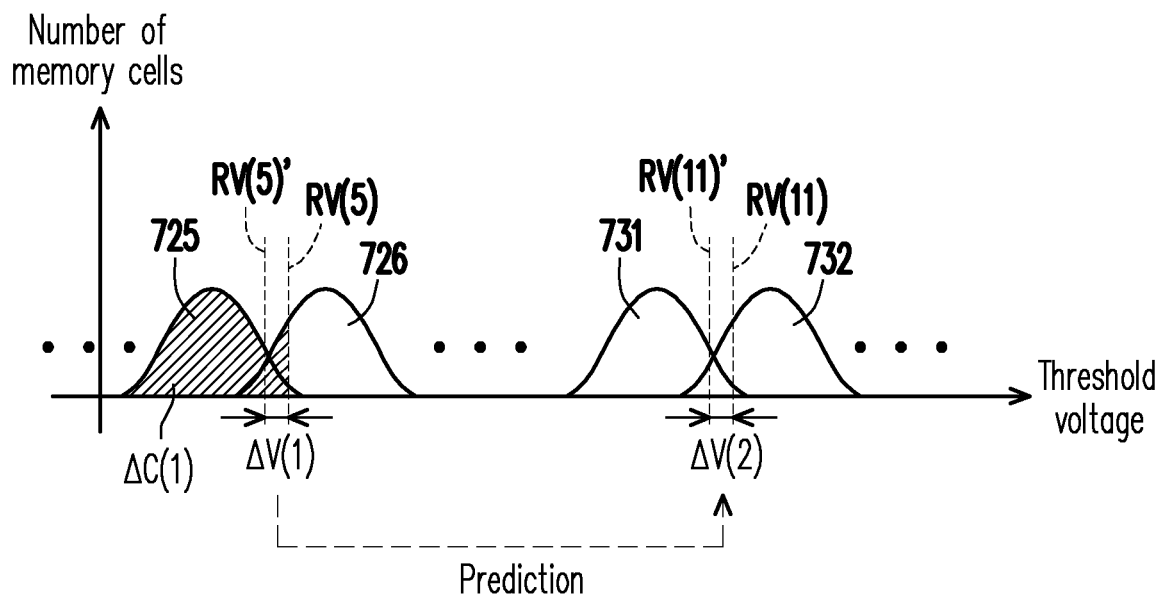
FIG. 8 is a schematic diagram of predicting a second read voltage level according to the first count information corresponding to the first read voltage level according to an exemplary embodiment of the disclosure.

FIG. 8 is a schematic diagram of predicting a second read voltage level according to the first count information corresponding to the first read voltage level according to an exemplary embodiment of the disclosure.

Referring to FIG. 8, it is assumed that the first read voltage level to be corrected is the read voltage level RV(5), and the second read voltage level to be corrected is the read voltage level RV(11). The read voltage level RV(5) is configured to distinguish the states 725 and 726 in the threshold voltage distribution. The read voltage level RV(11) is configured to distinguish the states 731 and 732 in the threshold voltage distribution.

It should be noted that there is a significant offset between the read voltage level RV(5) and the threshold voltage distribution (including the states 725 and 726) before the read voltage level RV(5) is corrected. Similarly, there is also a significant offset between the read voltage level RV(11) and the threshold voltage distribution (including the states 731 and 732) before the read voltage level RV(11) is corrected.

After using the read voltage level RV(5) to read multiple memory cells, the memory management circuit 51 may obtain the count information $\Delta C(1)$ (i.e., the first count information) corresponding to the read voltage level RV(5) according to the read result. For example, assuming that a certain memory cell may be turned on by the read voltage level RV(5), the read result has a bit "1" (or a bit "0") corresponding to this memory cell. The memory management circuit 51 may obtain the count information $\Delta C(1)$ according to the total number of bits "1" (or bits "0") in the read result. Thus, the count information $\Delta C(1)$ may reflect the total number of memory cells (i.e., the first memory cells) that may be turned on by the read voltage level RV(5) among the read memory cells. In an exemplary embodiment, the value of the count information $\Delta C(1)$ may also reflect the total area of the hatched area in FIG. 8.

After obtaining the count information $\Delta C(1)$, the memory management circuit 51 may predict the read voltage level RV(11)' according to the count information $\Delta C(1)$. The read voltage level RV(11)' is the corrected read voltage level RV(11). For example, the memory management circuit 51 may input the count information $\Delta C(1)$ into an equation or a look-up table and obtain the voltage value of the read voltage level RV(11)' according to the output of the equation or the look-up table.

In an exemplary embodiment, the difference between the count information $\Delta C(1)$ and the preset count information (also referred to as the first preset count information) may reflect an offset between the read voltage level RV(5) and the threshold voltage distribution. Taking FIG. 8 as an example, the first preset count information may reflect the total number of memory cells that are preset to belong to the states 721 to 725 among the memory cells. For example, the value of the first preset count information may be equal to or close to 5×(N/16), where N is the total number of memory cells.

In an exemplary embodiment, the memory management circuit 51 may predict the read voltage level RV(11)' according to the difference between the count information $\Delta C(1)$ and the first preset count information. For example, the memory management circuit 51 may input the difference into an equation or a look-up table and obtain the voltage value of the read voltage level RV(11)' according to the output of the equation or the look-up table.

In an exemplary embodiment, the memory management circuit 51 may obtain correction information (also referred to as a second correction information) $\Delta V(2)$ according to the count information $\Delta C(1)$. For example, the memory management circuit 51 may input the count information $\Delta C(1)$ or the difference into an equation or a look-up table and obtain the correction information $\Delta V(2)$ according to the output of the equation or the look-up table. The memory management circuit 51 may correct the read voltage level RV(11) according to the correction information $\Delta V(2)$ to obtain the read voltage level RV(11)'. For example, the memory management circuit 51 may add or subtract the voltage value corresponding to the correction information $\Delta V(2)$ to the read voltage level RV(11) to obtain the read voltage level RV(11)'. As shown in FIG. 8, the read voltage level RV(11)' is closer to the boundary between the states 731 and 732 than the read voltage level RV(11). Therefore, the read voltage level RV(11)' may be configured to distinguish the states 731 and 732 more accurately than the read voltage level RV(11).

In an exemplary embodiment, the memory management circuit 51 may obtain correction information (also referred to as a first correction information) $\Delta V(1)$ according to the count information $\Delta C(1)$. The correction information $\Delta V(1)$ may be configured to correct the read voltage level RV(5). For example, the memory management circuit 51 may input the count information $\Delta C(1)$ or the difference into an equation or a look-up table and obtain the correction information $\Delta V(1)$ according to the output of the equation or the look-up table. The memory management circuit 51 may correct the read voltage level RV(5) according to the correction information $\Delta V(1)$. For example, the memory management circuit 51 may add or subtract the voltage value corresponding to the correction information ΔV(1) to the read voltage level RV(5) to obtain the read voltage level RV(5)'. As shown in FIG. 8, the read voltage level RV(5)' is closer to the boundary between the states 725 and 726 than the read voltage level RV(5). Therefore, the read voltage level RV(5)' may be configured to distinguish the states 725 and 726 more accurately than the read voltage level RV(5).

In an exemplary embodiment, the memory management circuit 51 may obtain the correction information ΔV(2) according to the correction information ΔV(1). There may be a linear or non-linear relationship between the correction information ΔV(1) and ΔV(2). For example, the memory management circuit 51 may input the correction information ΔV(1) into an equation or a look-up table and obtain the correction information ΔV(2) according to the output of the equation or the look-up table.

In an exemplary embodiment, the memory management circuit 51 may obtain the correction information ΔV(2) according to the following equations (1.1) and (1.2).

$$\Delta V(2) = C(1) \times \Delta V(1) C(5) \ldots \quad (1.1)$$

$$C(5) = (C(2) \times \alpha(NPE, T))/C(3) \; (C(2) \times \alpha(1))/C(4) \ldots \quad (1.2)$$

In equations (1.1) and (1.2), C(1) to C(5), α(NPE, T) and α(1) are all parameters and may be set according to the current measured value and/or preset value. For example, the parameter α(NPE, T) may reflect the rate at which the memory cells lose electrons vertically to the substrate based on specific wear conditions and temperatures, while the parameter α(1) may reflect the rate at which electrons in the memory cells flow to memory cells on adjacent word lines. In addition, the values of the parameters in the equations (1.1) and (1.2) and the design of the overall equation may be adjusted according to practical requirements, which are not limited by the disclosure. In addition, the first read voltage level and the second read voltage level may also be any two of the read voltage levels RV(1) to RV(15), which is not limited by the disclosure.

In an exemplary embodiment, it is assumed that the first read voltage level and the second read voltage level are respectively the read voltage levels RV(i) and RV(j) among the read voltage levels RV(1) to RV(15), and i is not equal to j. The memory management circuit 51 may select an appropriate equation or look-up table according to the pairing or combination of the read voltage levels RV(i) and RV(j). After the equation or the look-up table is selected, the memory management circuit 51 may input the count information or correction information (i.e., the first correction information) corresponding to the read voltage level RV(i) into the equation or the look-up table and obtain the correction information (i.e., the second correction information) corresponding to the read voltage level RV(j) according to the output of the equation or the look-up table. Then, the memory management circuit 51 may correct the read voltage level RV(j) according to the second correction information.

It should be noted that, traditionally, when it is intended to correct the second read voltage level (e.g., the read voltage level RV(11)), it is often necessary to use the read voltage level RV(11) to be corrected to read the memory cells, so that the read voltage level RV(11) is corrected according to the read result or the decoded result corresponding to the read voltage level RV(11). However, such an approach is inefficient when there are many read voltage levels to be corrected (e.g., there are 15 read voltage levels that need to be corrected in FIG. 7).

In an exemplary embodiment, the step of predicting the second read voltage level according to the count information corresponding to the first read voltage level does not include nor require to use the second read voltage level to be corrected to read the memory cells. Taking FIG. 8 as an example, after using the read voltage level RV(5) to read multiple memory cells to obtain the count information ΔC(1), the read voltage level RV(11)' may be predicted directly on the premise of not using the read voltage level RV(11) to read the memory cells. Similarly, the corrected voltage positions of the rest of the read voltage levels may also be predicted one by one according to the count information (or the first correction information) corresponding to the first read voltage level. Thereby, the correction efficiency of the read voltage level may be effectively improved.

In an exemplary embodiment, before using the first read voltage level to read the memory cells, the memory management circuit 51 may add an adjustment value (also referred to as a first adjustment value) to the first read voltage level, so that the first read voltage level is closer to a certain peak in the threshold voltage distribution. Then, the memory management circuit 51 may use the adjusted first read voltage level to read the memory cells to obtain another count information (also referred to as a second count information). The second count information may replace the first count information to predict the second read voltage level.

Figure 9:
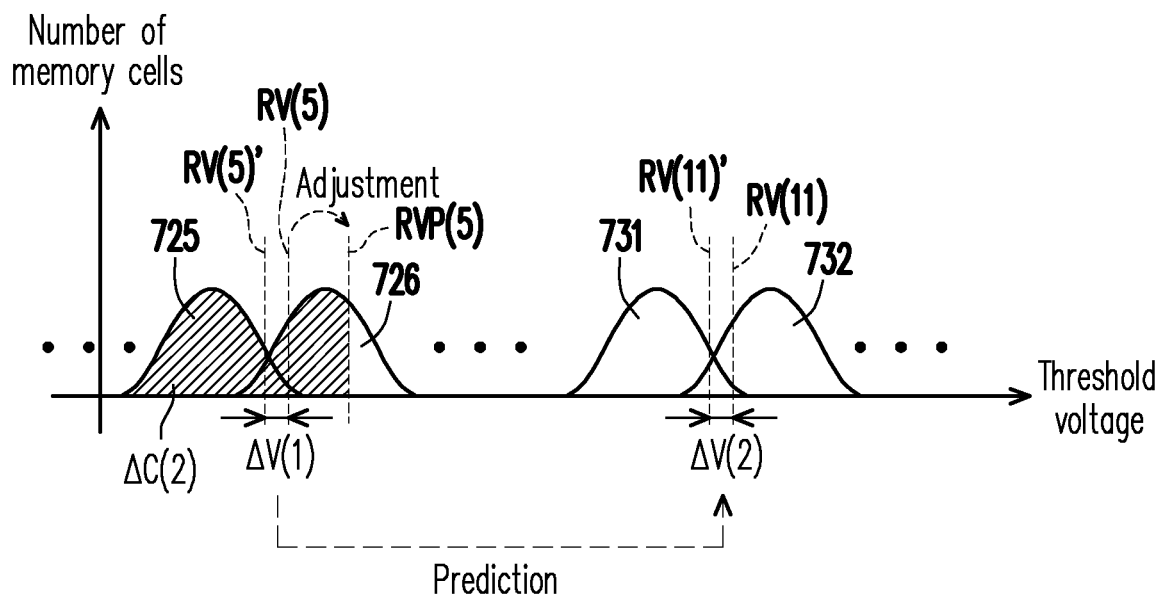
FIG. 9 is a schematic diagram of predicting a second read voltage level according to the second count information corresponding to the first read voltage level according to an exemplary embodiment of the disclosure.

FIG. 9 is a schematic diagram of predicting a second read voltage level according to the second count information corresponding to the first read voltage level according to an exemplary embodiment of the disclosure.

Referring to FIG. 9, it is assumed that the first read voltage level to be corrected is the read voltage level RV(5), and the second read voltage level to be corrected is the read voltage level RV(11).

In an exemplary embodiment, the memory management circuit 51 may first adjust the read voltage level RV(5) to the read voltage level RVP(5). In particular, the read voltage level RVP(5) is closer to the peak of the state 726 than the read voltage level RV(5). Then, the memory management circuit 51 may instruct the rewritable non-volatile memory module 43 to use the read voltage level RVP(5) to read the memory cells and obtain the count information ΔC(2) (i.e., the second count information) according to the read result. For example, the count information ΔC(2) may reflect the total number of memory cells that may be turned on by the read voltage level RVP(5) among the memory cells (equivalent to the total area of the hatched area in FIG. 9). Then, the memory management circuit 51 may predict the read voltage level RV(11)' according to the count information ΔC(2).

In an exemplary embodiment, the memory management circuit 51 may obtain the correction information ΔV(1) (i.e., the first correction information) according to the count information ΔC(2). For example, the memory management circuit 51 may obtain the correction information ΔV(1) according to the difference between the count information ΔC(2) and the preset count information (also referred to as the second preset count information). Then, the memory management circuit 51 may obtain the correction information ΔV(2) according to the correction information ΔV(1), and correct the read voltage level RV(11) to the read voltage level RV(11)' according to the correction information ΔV(2). Alternatively, in an exemplary embodiment, the memory management circuit 51 may directly predict the voltage value of the read voltage level RV(11)' according to the count information ΔC(2). The relevant operation details are the same as or similar to the operation of predicting the read voltage level RV(11)' by using the count information ΔC(1) in the aforementioned exemplary embodiments, and are not repeated herein.

In an exemplary embodiment, the value of the second preset count information may be equal to the sum of the value of the first preset count information and an adjustment value (also referred to as a second adjustment value). In addition, by using the read voltage level RVP(5) closer to the peak of the state 726 to read the memory cell than the read voltage level RV(5), the value of the obtained count information may be amplified (i.e., ΔC(2) is greater than ΔC(1)), so as to more accurately correct the first read voltage level and/or the second read voltage level. For example, compared with the count information ΔC(1), the amplified count information ΔC(2) may reduce the adverse effect caused by the defects (e.g., the distribution of bits "1" and "0" in the random data is not completely consistent) of the aforementioned randomization operation on the subsequent correction of the read voltage level.

In an exemplary embodiment, the total number of the first read voltage levels configured to predict the second read voltage level may also be multiple. For example, in an exemplary embodiment, the first read voltage level may include read voltage levels RV(x) and RV(y) among the read voltage levels RV(1) to RV(15) in FIG. 7, and the second read voltage level to be corrected may include the read voltage level RV(z) among the read voltage levels RV(1) to RV(15), where x, y, and z are different. In an exemplary embodiment, the count information respectively obtained from reading the memory cells by using the read voltage levels RV(x) and RV(y) may be used to jointly correct the read voltage level RV(z) (i.e., to predict the corrected read voltage level RV(z)').

In an exemplary embodiment, the memory management circuit 51 may obtain the correction information ΔV(2) in FIG. 8 or FIG. 9 according to the following equation (2.1).

$$\Delta V(2) = (C(1) \times \Delta V(1) C(5))/2 \ (C(6) \times \Delta V(3) \ C(7))/2 \quad (2.1)$$

In equation (2.1), ΔV(1) represents the correction information corresponding to the read voltage level RV(x), ΔV(3) represents the correction information corresponding to the read voltage level RV(y), C(1) to C(7) are all parameters and may be set according to the current measured value and/or preset value. In addition, the values of the parameters in the equation (2.1) and the design of the overall equation may be adjusted according to practical requirements, which are not limited by the disclosure. In addition, please refer to the aforementioned exemplary embodiments for the method of obtaining the correction information corresponding to each first read voltage level, and the details are not repeated herein. In addition, more count information or correction information corresponding to the first read voltage level may also be configured to predict the second read voltage level, which is not limited by the disclosure.

In an exemplary embodiment, the memory management circuit 51 may determine whether multiple read voltage levels belong to the same category. In an exemplary embodiment, in response to the first read voltage level and the second read voltage level belonging to the same category, the memory management circuit 51 may predict the second read voltage level according to the count information corresponding to the first read voltage level. In an exemplary embodiment, in response to the first read voltage level not belonging to the same category as a certain read voltage level (also referred to as a third read voltage level), the memory management circuit 51 does not predict the third read voltage level according to the count information corresponding to the first read voltage level. For example, the third read voltage level is configured to distinguish multiple adjacent states (also referred to as the fifth state and the sixth state) in the threshold voltage distribution.

Figure 10:
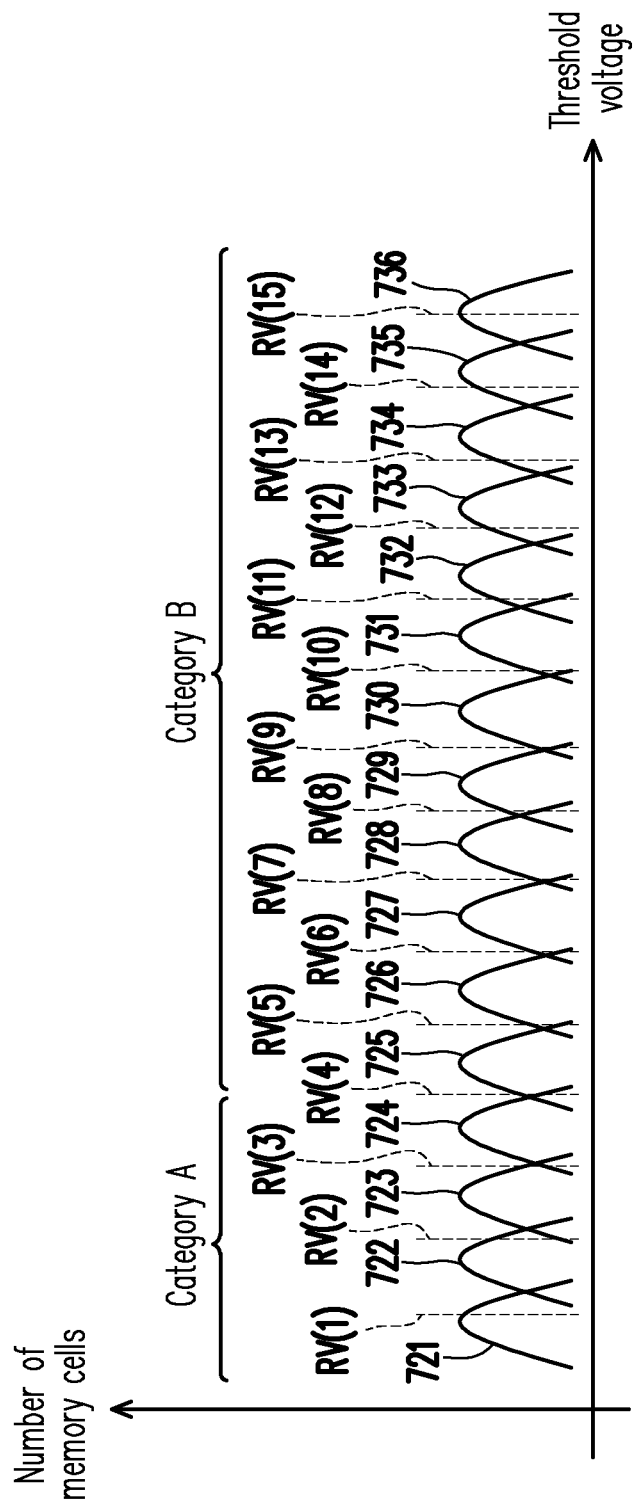
FIG. 10 is a schematic diagram of categorizing multiple read voltage levels according to an exemplary embodiment of the disclosure.

FIG. 10 is a schematic diagram of categorizing multiple read voltage levels according to an exemplary embodiment of the disclosure.

Referring to FIG. 10, in an exemplary embodiment, the memory management circuit 51 may categorize the read voltage levels RV(1) to RV(15). For example, the read voltage levels RV(1) to RV(3) are categorized into category A, and the read voltage levels RV(4) to RV(15) are categorized into category B. However, the categorization rules for the read voltage levels RV(1) to RV(15) may also be adjusted according to practical requirements, which is not limited in the disclosure.

In an exemplary embodiment, only when the first read voltage level and the second read voltage level belong to the same category (such as category A or category B), the memory management circuit 51 may predict the second read voltage level according to the count information corresponding to the first read voltage level. In an exemplary embodiment, if the first read voltage level belongs to category A and the third read voltage level belongs to category B (or the first read voltage level belongs to category B and the third read voltage level belongs to category A), the memory management circuit 51 does not allowed to predict the third read voltage level according to the count information corresponding to the first read voltage level.

In an exemplary embodiment, the memory management circuit 51 may determine the category of a specific read voltage level according to at least one cause of an offset between a specific read voltage level and the threshold voltage distribution. For example, the causes of the offset between a specific read voltage level and the threshold voltage distribution may be mainly divided into data retention defect and read disturbance. A data retention defect is a condition in which a memory cell loses electrons vertically to the substrate. A read disturbance defect is a condition in which electrons in a memory cell flow to adjacent word lines.

In an exemplary embodiment, taking the second read voltage level as an example, if the main cause of the offset between the second read voltage level and the threshold voltage distribution is a data retention defect, the memory management circuit 51 may determine that the second read voltage level belongs to the first category (e.g., category A in FIG. 10). In addition, if the main cause of the offset between the second read voltage level and the threshold voltage distribution is a read disturbance defect, the memory management circuit 51 may determine that the second read voltage level belongs to the second category (e.g., category B in FIG. 10). In an exemplary embodiment, the memory management circuit 51 may also adopt other categorization rules to categorize the read voltage levels RV(1) to RV(15). In addition, in an exemplary embodiment, the memory management circuit 51 may not categorize the read voltage levels RV(1) to RV(15).

In an exemplary embodiment, the memory management circuit 51 may use at least one read voltage level including a first read voltage level to read data (also referred to as first data) from the memory cells. After obtaining the first data, the memory management circuit 51 may instruct the error detecting and correcting circuit 54 to perform a decoding operation (also referred to as a hard decoding operation) on the first data in an attempt to correct errors in the first data. If the hard decoding operation on the first data is successful (indicating that all errors in the first data have been corrected), the memory management circuit 51 may output the successfully decoded first data. For example, in response to the read command from the host system 11, the memory management circuit 51 may read the first data and send the successfully decoded first data back to the host system 11. In addition, if the hard decoding operation for the first data fails, the memory management circuit 51 may perform a read voltage correction operation. For example, in the read voltage correction operation, the memory management circuit 51 may instruct the rewritable non-volatile memory module 43 to use the first read voltage level to read the memory cells and predict the second read voltage level according to the count information. The relevant operation details have been described in detail above, and are not repeated herein.

In an exemplary embodiment, if a certain decoding in the hard decoding operation cannot correct all errors in the first data (i.e., the decoding fails), the memory management circuit 51 may update a retry count (e.g., adding one to the retry count) and determine whether the retry count reaches the preset value. If the retry count does not reach the preset value, the memory management circuit 51 may query a retry table to change the used read voltage level (including the first read voltage level). Then, the memory management circuit 51 may use the changed read voltage level to re-read the data of the memory cells until the read data (i.e., the first data) may be successfully decoded or the retry count reaches the preset value. In an exemplary embodiment, if the retry count reaches a preset value, the memory management circuit 51 may perform the read voltage correction operation.

Figure 11:
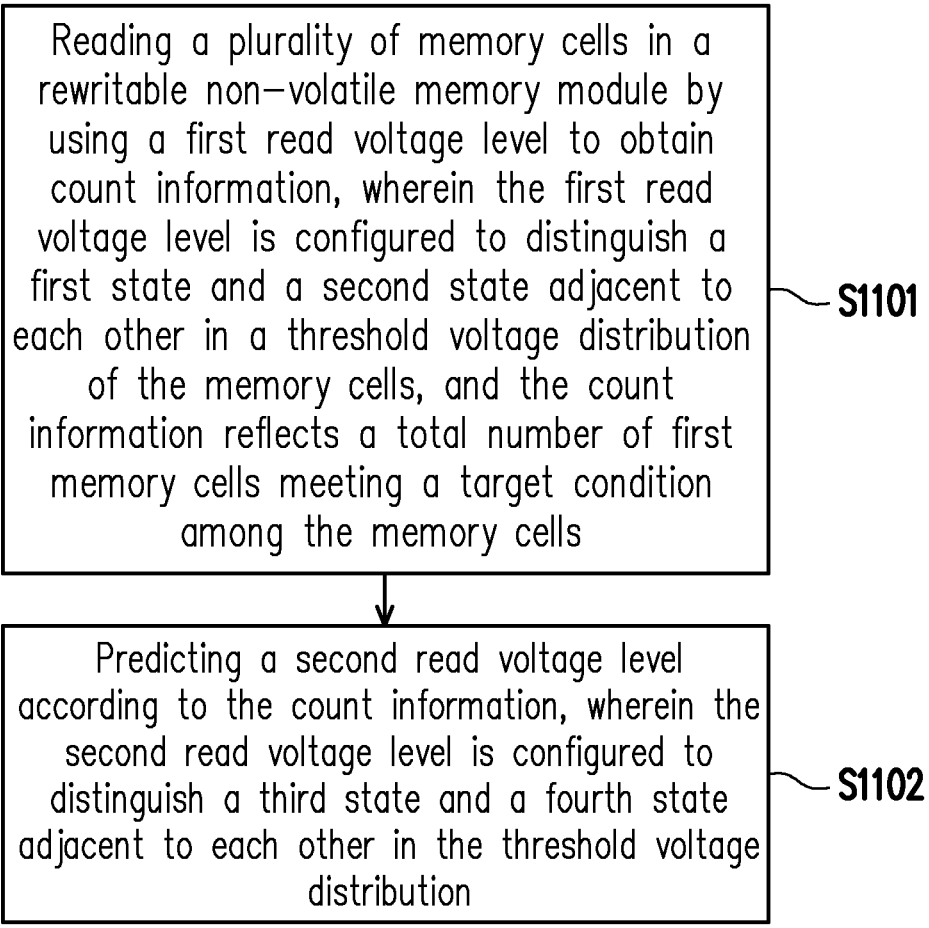
FIG. 11 is a flowchart of a voltage prediction method according to an exemplary embodiment of the disclosure.

FIG. 11 is a flowchart of a voltage prediction method according to an exemplary embodiment of the disclosure.

Referring to FIG. 11, in step S1101, multiple memory cells in a rewritable non-volatile memory module are read by using a first read voltage level to obtain count information. The first read voltage level is configured to distinguish a first state and a second state adjacent to each other in a threshold voltage distribution of the memory cells, and the count information reflects a total number of first memory cells meeting a target condition among the memory cells. In step S1102, a second read voltage level is predicted according to the count information. The second read voltage level is configured to distinguish a third state and a fourth state adjacent to each other in the threshold voltage distribution.

Figure 12:
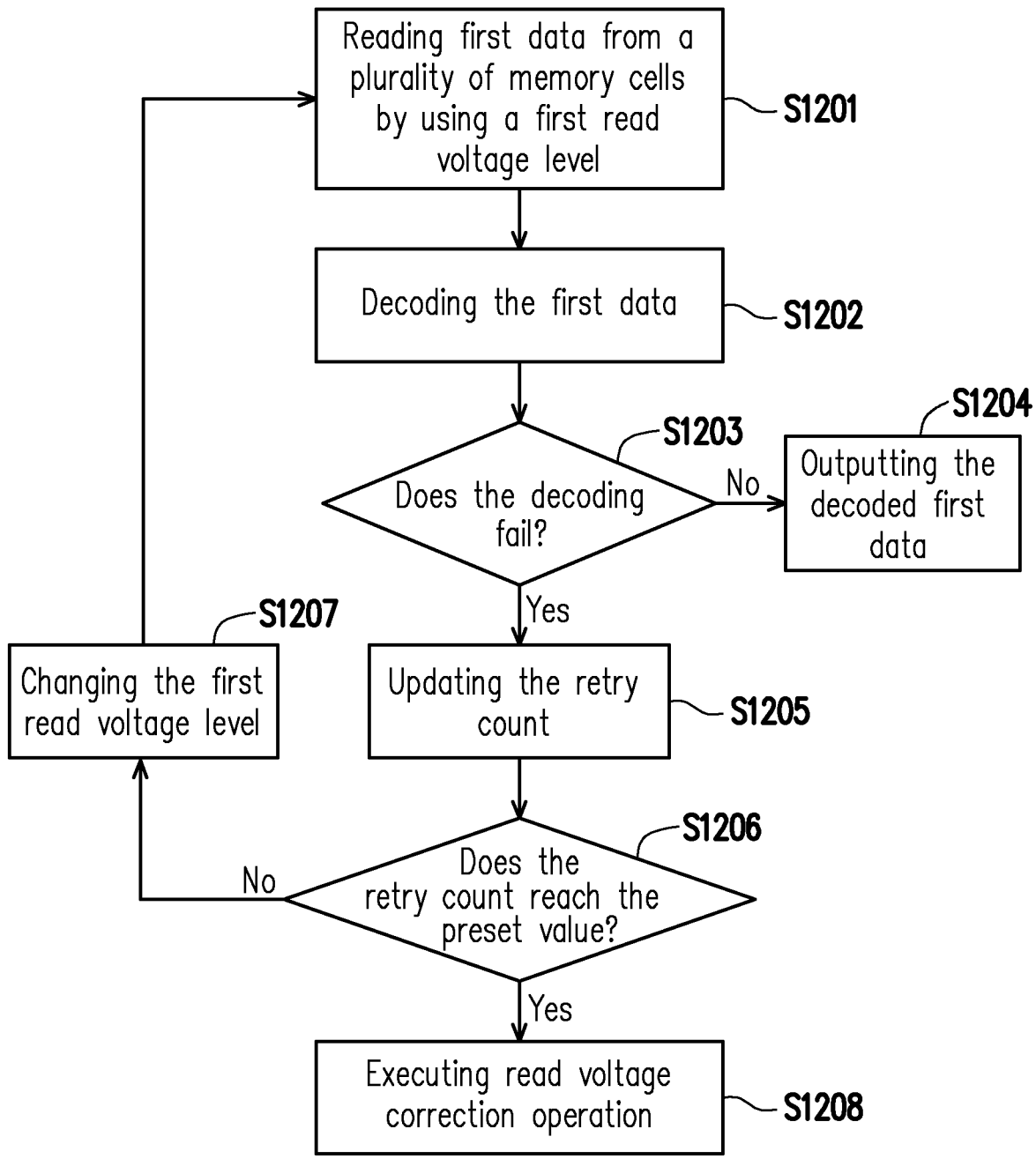
FIG. 12 is a flowchart of a voltage prediction method according to an exemplary embodiment of the disclosure.

FIG. 12 is a flowchart of a voltage prediction method according to an exemplary embodiment of the disclosure.

Referring to FIG. 12, in step S1201, a first data is read from multiple memory cells by using a first read voltage level. In step S1202, the first data is decoded. In step S1203, whether the decoding of the first data fails is determined. If the decoding of the first data does not fail (i.e., the decoding is successful), in step S1204, the decoded first data is output. If the decoding of the first data fails, in step S1205, the retry count is updated. In step S1206, whether the retry count reaches a preset value is determined. If the retry count does not reach the preset value, in step S1207, the first read voltage level is changed, and step S1201 is repeated. In addition, if the retry count reaches the preset value, in step S1208, a read voltage correction operation is performed.

However, each step in FIG. 11 and FIG. 12 has been described in detail as the above, and are not repeated herein.

It should be noted that each step in FIG. 11 and FIG. 12 may be implemented as multiple program codes or circuits, which is not limited by the disclosure. In addition, the methods of FIG. 11 and FIG. 12 may be used in conjunction with the above exemplary embodiments, or may also be used alone, which is not limited by the disclosure.

To sum up, the voltage prediction method, the memory storage device, and the memory control circuit unit proposed by the exemplary embodiments of the disclosure may effectively improve the correction efficiency of the read voltage level on the premise of reducing repeated reading of the same memory cell as much as possible.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A voltage prediction method for a rewritable non-volatile memory module, the voltage prediction method comprising:
   reading a plurality of memory cells in the rewritable non-volatile memory module by using a first read voltage level to obtain count information, wherein the first read voltage level is configured to distinguish a first state and a second state adjacent to each other in a threshold voltage distribution of the plurality of memory cells, and the count information reflects a total number of first memory cells meeting a target condition among the plurality of memory cells; and
   predicting a second read voltage level according to the count information without reading the plurality of memory cells by using a second read voltage level to be corrected, wherein the second read voltage level and the second read voltage level to be corrected are both configured to distinguish a third state and a fourth state adjacent to each other in the threshold voltage distribution.

2. The voltage prediction method according to claim 1, wherein a difference between the count information and a preset count information reflects an offset between the first read voltage level and the threshold voltage distribution.

3. The voltage prediction method according to claim 1, wherein predicting the second read voltage level according to the count information comprises:
   obtaining second correction information according to the count information; and
   correcting the second read voltage level according to the second correction information.

4. The voltage prediction method according to claim 3, wherein obtaining the second correction information according to the count information comprises:
   obtaining first correction information according to the count information, wherein the first correction information is configured to correct the first read voltage level; and
   obtaining the second correction information according to the first correction information.

5. The voltage prediction method according to claim 1, wherein predicting the second read voltage level according to the count information does not comprise reading the plurality of memory cells by using the second read voltage level that is to be corrected.

6. The voltage prediction method according to claim 1, wherein the first read voltage level and the second read voltage level belong to a same category, and the voltage prediction method further comprises:

in response to the first read voltage level and the third read voltage level not belonging to the same category, not predicting the third read voltage level according to the count information, wherein the third read voltage level is configured to distinguish a fifth state and a sixth state adjacent to each other in the threshold voltage distribution.

7. The voltage prediction method according to claim 1, wherein predicting the second read voltage level according to the count information comprises:

determining a category of the second read voltage level according to at least one cause of an offset between the second read voltage level and the threshold voltage distribution; and in response to the first read voltage level and the second read voltage level belonging to a same category, predicting the second read voltage level according to the count information.

8. The voltage prediction method according to claim 1, further comprising:

performing a hard decoding operation on first data read from the plurality of memory cells; and in response to the hard decoding operation performed on the first data failing or a retry count corresponding to the hard decoding operation reaching a preset value, performing a read voltage correction operation to read the plurality of memory cells by using the first read voltage level in the read voltage correction operation and predict the second read voltage level according to the count information.

9. The voltage prediction method according to claim 1, wherein reading the plurality of memory cells in the rewritable non-volatile memory module by using the first read voltage level to obtain the count information comprises:

adding an adjustment value to the first read voltage level so that the first read voltage level is closer to a peak in the threshold voltage distribution; and reading the plurality of memory cells by using an adjusted first read voltage level to obtain the count information.

10. A memory storage device, comprising:

a connection interface unit, configured to couple to a host system;

a rewritable non-volatile memory module; and a memory control circuit unit, coupled to the connection interface unit and the rewritable non-volatile memory module, wherein the memory control circuit unit is configured to:

send at least one read command sequence, wherein the at least one read command sequence is configured to instruct to read a plurality of memory cells in the rewritable non-volatile memory module by using a first read voltage level to obtain count information, wherein the first read voltage level is configured to distinguish a first state and a second state adjacent to each other in a threshold voltage distribution of the plurality of memory cells, and the count information reflects a total number of first memory cells meeting a target condition among the plurality of memory cells; and predict a second read voltage level according to the count information without reading the plurality of memory cells by using a second read voltage level to be corrected, wherein the second read voltage level and the second read voltage level to be corrected are both configured to distinguish a third state and a fourth state adjacent to each other in the threshold voltage distribution.

11. The memory storage device according to claim 10, wherein a difference between the count information and a preset count information reflects an offset between the first read voltage level and the threshold voltage distribution.

12. The memory storage device according to claim 10, wherein the memory control circuit unit predicting the second read voltage level according to the count information comprises:

obtaining second correction information according to the count information; and correcting the second read voltage level according to the second correction information.

13. The memory storage device according to claim 12, wherein the memory control circuit unit obtaining the second correction information according to the count information comprises:

obtaining first correction information according to the count information, wherein the first correction information is configured to correct the first read voltage level; and obtaining the second correction information according to the first correction information.

14. The memory storage device according to claim 10, wherein the memory control circuit unit predicting the second read voltage level according to the count information does not comprise reading the plurality of memory cells by using the second read voltage level that is to be corrected.

15. The memory storage device according to claim 10, wherein the first read voltage level and the second read voltage level belong to a same category, wherein the memory control circuit unit is further configured to:

in response to the first read voltage level and the third read voltage level not belonging to the same category, not predict the third read voltage level according to the count information, wherein the third read voltage level is configured to distinguish a fifth state and a sixth state adjacent to each other in the threshold voltage distribution.

16. The memory storage device according to claim 10, wherein the memory control circuit unit predicting the second read voltage level according to the count information comprises:

determining a category of the second read voltage level according to at least one cause of an offset between the second read voltage level and the threshold voltage distribution; and in response to the first read voltage level and the second read voltage level belonging to a same category, predicting the second read voltage level according to the count information.

17. The memory storage device according to claim 10, wherein the memory control circuit unit is further configured to:

perform a hard decoding operation on first data read from the plurality of memory cells; and in response to the hard decoding operation performed on the first data failing or a retry count corresponding to the hard decoding operation reaching a preset value, perform a read voltage correction operation to read the plurality of memory cells by using the first read voltage level in the read voltage correction operation and predict the second read voltage level according to the count information.

18. The memory storage device according to claim 10, wherein the memory control circuit unit sending the at least one read command sequence comprises:
  adding an adjustment value to the first read voltage level so that the first read voltage level is closer to a peak in the threshold voltage distribution; and
  sending the at least one read command sequence to instruct to read the plurality of memory cells by using an adjusted first read voltage level to obtain the count information.

19. A memory control circuit unit for controlling a rewritable non-volatile memory module, the memory control circuit unit comprising:
  a host interface, configured to couple to a host system;
  a memory interface, configured to couple to the rewritable non-volatile memory module; and
  a memory management circuit, coupled to the host interface and the memory interface,
  wherein the memory management circuit is configured to:
  send at least one read command sequence, wherein the at least one read command sequence is configured to instruct to read a plurality of memory cells in the rewritable non-volatile memory module by using a first read voltage level to obtain count information, wherein the first read voltage level is configured to distinguish a first state and a second state adjacent to each other in a threshold voltage distribution of the plurality of memory cells, and the count information reflects a total number of first memory cells meeting a target condition among the plurality of memory cells; and
  predict a second read voltage level according to the count information without reading the plurality of memory cells by using a second read voltage level to be corrected, wherein the second read voltage level and the second read voltage level to be corrected are both configured to distinguish a third state and a fourth state adjacent to each other in the threshold voltage distribution.

20. The memory control circuit unit according to claim 19, wherein a difference between the count information and a preset count information reflects an offset between the first read voltage level and the threshold voltage distribution.

21. The memory control circuit unit according to claim 19, wherein the memory management circuit predicting the second read voltage level according to the count information comprises:
  obtaining second correction information according to the count information; and
  correcting the second read voltage level according to the second correction information.

22. The memory control circuit unit according to claim 21, wherein the memory management circuit obtaining the second correction information according to the count information comprises:
  obtaining first correction information according to the count information, wherein the first correction information is configured to correct the first read voltage level; and
  obtaining the second correction information according to the first correction information.

23. The memory control circuit unit according to claim 19, wherein the memory management circuit predicting the second read voltage level according to the count information does not comprise reading the plurality of memory cells by using the second read voltage level that is to be corrected.

24. The memory control circuit unit according to claim 19, wherein the first read voltage level and the second read voltage level belong to a same category, and the memory management circuit is further configured to:
  in response to the first read voltage level and the third read voltage level not belonging to the same category, not predict the third read voltage level according to the count information, wherein the third read voltage level is configured to distinguish a fifth state and a sixth state adjacent to each other in the threshold voltage distribution.

25. The memory control circuit unit according to claim 19, wherein the memory management circuit predicting the second read voltage level according to the count information comprises:
  determining a category of the second read voltage level according to at least one cause of an offset between the second read voltage level and the threshold voltage distribution; and
  in response to the first read voltage level and the second read voltage level belonging to a same category, predicting the second read voltage level according to the count information.

26. The memory control circuit unit according to claim 19, wherein the memory control circuit unit further comprises an error detecting and correcting circuit, coupled to the memory management circuit,
  the error detecting and correcting circuit is configured to perform a hard decoding operation on first data read from the plurality of memory cells; and
  the memory management circuit is further configured to, in response to the hard decoding operation performed on the first data failing or a retry count corresponding to the hard decoding operation reaching a preset value, perform a read voltage correction operation to read the plurality of memory cells by using the first read voltage level in the read voltage correction operation and predict the second read voltage level according to the count information.

27. The memory control circuit unit according to claim 19, wherein the memory management circuit sending the at least one read command sequence comprises:
  adding an adjustment value to the first read voltage level so that the first read voltage level is closer to a peak in the threshold voltage distribution; and
  sending the at least one read command sequence to instruct to read the plurality of memory cells by using an adjusted first read voltage level to obtain the count information.

* * * * *